United States Patent
Choi et al.

(10) Patent No.: US 8,278,981 B2
(45) Date of Patent: Oct. 2, 2012

(54) LOW POWER VARIABLE DELAY CIRCUIT

(75) Inventors: Hae-Rang Choi, Gyeonggi-do (KR);
Yong-Ju Kim, Gyeonggi-do (KR);
Sung-Woo Han, Gyeonggi-do (KR);
Hee-Woong Song, Gyeonggi-do (KR);
Ic-Su Oh, Gyeonggi-do (KR);
Hyung-Soo Kim, Gyeonggi-do (KR);
Tae-Jin Hwang, Gyeonggi-do (KR);
Ji-Wang Lee, Gyeonggi-do (KR);
Jae-Min Jang, Gyeonggi-do (KR);
Chang-Kun Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 330 days.

(21) Appl. No.: 12/636,901

(22) Filed: Dec. 14, 2009

(65) Prior Publication Data

US 2010/0164568 A1 Jul. 1, 2010

(30) Foreign Application Priority Data

Dec. 26, 2008 (KR) .................. 10-2008-0134581

(51) Int. Cl.
*H03L 7/00* (2006.01)
(52) U.S. Cl. ...................... 327/153; 327/152
(58) Field of Classification Search ............... 327/149, 327/152, 153, 158, 161
See application file for complete search history.

(56) References Cited

U.S. PATENT DOCUMENTS 7,336,752 B2 * 2/2008 Vlasenko et al. ............. 375/376

FOREIGN PATENT DOCUMENTS

| JP | 06-326570 A | 11/1994 |
|---|---|---|
| JP | 2007-281852 A | 10/2007 |
| KR | 1019990087858 A | 12/1999 |
| KR | 1020060118892 A | 11/2006 |
| KR | 10-0855274 B1 | 8/2008 |
| KR | 1020080075414 A | 8/2008 |

* cited by examiner

*Primary Examiner* — Lincoln Donovan
*Assistant Examiner* — Diana J Cheng
(74) *Attorney, Agent, or Firm* — Ladas & Parry LLP

(57) ABSTRACT

A variable delay circuit includes at least a fixed delay unit, a first selection unit, and variable delay unit. The fixed delay unit receives an input signal and a first delay selection signal indicative of a first delay, and outputs a first delayed signal that is substantially the input signal delayed by the first delay. The first selection unit receives the input signal, the first delayed signal, and a second delay selection signal, and outputs either the input signal or the first delayed signal based on the second delay selection signal to the variable delay unit. The variable delay unit also receives a third delay selection signal indicative of a third delay, and outputs a output signal that is substantially the output signal of the selection unit delayed by a third delay. The first delay is 0 or X multiples of M delay units. The third delay is a delay selected from 0 to N delay units.

11 Claims, 8 Drawing Sheets

LOW POWER VARIABLE DELAY CIRCUIT

CROSS-REFERENCE TO RELATED APPLICATIONS

The present application claims priority of Korean Patent Application No. 10-2008-0134581, filed on Dec. 26, 2008, which is incorporated herein by reference in its entirety.

BACKGROUND OF THE INVENTION

The present application relates generally to a delay circuit, and more particularly to a variable delay circuit having one or more delay elements that are configured for low power operations in a high integration environment.

A delay circuit in a semiconductor device controls the output timing of an input signal such that the inputted signal is outputted after a predetermined delay as an output signal of the delay circuit. In digital circuitry, multiple digital signals could be simultaneously inputted for processing, but the order according to which these inputted multiple signals should be made available for processing must be controlled in order to produce appropriate signals (e.g., control signals, data signals, etc.) at the appropriate timings or intervals in order to perform properly the required operations demanded by the digital circuitry. In general, a signal delay in a synchronous circuit that is synchronized to an external clock is measured in terms of the number of delayed clock cycles, and this is generally referred to as the latency of a signal. In this regard, a delay circuit controls the latency of an inputted signal.

For example, a conventional delay circuit controls the signal latency using a predetermined number of shift registers: SR1, SR2, SR3, . . . SR(n−1), SR(n) that are serially connected, and the operation of these serially connected shift registers is synchronously controlled by a clock signal. Each of the shift registers is designed to provide one-clock cycle delay. Thus, an input signal inputted to the series of shift registers SR1 to SR(n) would provide n number of delayed output signals L1 to L(n) at each output of the shift registers SR1 to SR(n). Then, any one of the n number of delayed signals L1 to L(n) can be chosen for the delayed output signal.

However, there are numerous problems associated with the conventional delay circuit. For example, if any of 0-16 clock cycle delays is desired, then 16 units of serially connected shift registers SR1 to SR16 would be required. From each of the shift registers, the delayed signals L0, L1, L2, L3, . . . L16 would be produced at each stage of the delay elements SR1 to SR16. Any one of the delayed signal L0 to L16 are available to be chosen to meet the need of the delayed circuit operation.

This means that a conventional delay circuit would require a total of "n" number of shift registers for a latency control of anywhere from 0 to "n" clock cycles. The number of shift registers is therefore determined by the maximum latency sought, and, this means that the size of the selection circuit (such as a multiplexer) needed for selecting one of the n number of delayed signals (i.e., L0 to L(n)) will inevitably be undesirably large as the number of shift register increases to realize a longer latency. This is very counterintuitive to high integration device sought by the modern circuit design.

For a larger latency "n," the number of signals L0 to L(n) inputted to the selection circuit such as a multiplexer will increase, and the parasitic resistance and capacitance associated with signals inputted to and outputted from the multiplexer will also increase. Additional buffers will be necessary in order to resolve the problems of parasitic resistance and capacitance, which in turn will demand undesirably increased power consumption and increased circuitry size.

The selection circuit or a multiplexer will respond to a selection signal such as SEL<0:n> in order to determine which one of the delay signals, for example L0 to L(n), should be outputted. The size of a decoder required for producing the multiplexer control signal S<0:n> will also inevitably increase for a larger latency "n." For example, the size of a decoder will double for each one-clock cycle increase in latency. Not only the size but also the electrical energy consumption increases since all of the "n" number of delay elements or the shift registers in the circuit needed for controlling the latency for 0 to "n" clock cycles must be turned on at all times.

Further, the latency required increases with the ever-increasing clock frequency implemented in the ever-advancing modern digital circuitry, which is more complex and designed to perform more and more of many different system functions. In order to perform more number of system functions, it will require more number of circuits needed to perform the required functions. This will in turn require more number of larger-size delay circuits in order to control the signal timing of the input/output signals utilized the increased number of circuits. This will cause the electrical power consumption to increase, which is counterintuitive to the low power requirement sought by the modern circuit design.

SUMMARY OF THE INVENTION

Against this backdrop, embodiments of the present invention have been developed.

A variable delay circuit includes at least a fixed delay unit, a first selection unit, and a variable delay unit. The fixed delay unit receives an input signal and at least one first delay selection signal indicative of a first delay, the fixed delay unit outputting a first delayed signal that is substantially the input signal delayed by the first delay. The first selection unit receives the input signal, the first delayed signal, and at least one second delay selection signal, and outputs either the input signal or the first delayed signal based on the at least one second delay selection signal. The variable delay unit receives the output signal of the first selection unit and at least one third delay selection signal indicative of a third delay, and outputs a delayed output signal that is substantially the output signal of the selection unit delayed by a third delay.

The first delay is 0 or a fixed delay of X multiples of M unit delays. The third delay is a delay selected from 0 to N unit delays, where X, M, or N is a positive integer. One unit delay substantially equals one predetermined cycle of a clock signal utilized in the variable delay circuit.

The fixed delay unit includes at least X number of fixed delay parts and X−1 number of selection parts. Each of the X number of fixed delay parts delays an inputted signal by M delay units. Each of the X−1 number of selection parts receives one of X−1 number of first selection signals. The X number of fixed delay parts and the X−1 number of selection parts are connected in series in an alternating manner such that one selection part is connected between two fixed delay parts. The input signal is applied to the first fixed delay part of the series and to each of the selection parts in the series. Each selection part receives the delayed output of the previous connected fixed delay part and outputs either the received delayed signal or the input signal to the next fixed delay part connected in series. The last fixed delay part connected in series outputs the delayed signal to the first selection unit.

The selection part outputs the received delayed signal when the received one of X−1 number of the first selection signal is at a predetermined level and outputs the input signal when the received one of X-1 number of the first selection signal is not at a predetermined level.

In the variable delay circuit according to an embodiment of the present invention, the fixed delay part includes M number of delay elements including flip flops such that each delay elements is configured to provide 1 unit delay. The first selection unit outputs the first delayed signal when the second delay selection signal is at a predetermined level and outputs the input signal when the second delay selection signal is not at a predetermined level.

The variable delay unit includes: N number of delay elements connected, in series, each delay element being configured to provide 1 unit delay; and a variable selection part receiving the output of the first selection unit, the outputs of the N number of delay elements, and the third delay selection signal.

The variable selection part is configured to output any one of the received signals as the output delay signal based on the third delay selection signal. One unit delay substantially equals one predetermined cycle of a clock signal utilized in the variable delay circuit.

In the variable delay circuit according to another embodiment of the present invention includes: a clock divider receiving a clock signal having a frequency of F and outputting a plurality of clock signals of different frequencies, where a clock signal having a frequency equivalent to F/M is provided to the fixed delay unit, and where the plurality of clock signals having frequencies of F/Y, Y being M to 1, are provided to a variable delay part. Each of the fixed delay part includes at least one delay element including a flip flop such that each delay element receiving the clock signal having a frequency equivalent to F/M is configured to provide a delay of M unit delays.

The first selection unit outputs the first delayed signal when the second delay selection signal is at a predetermined level and outputs the input signal when the second delay selection signal is not at a predetermined level.

The variable delay unit includes at least: a clock selection part receiving, the plurality of clock signals having frequencies of F/Y, Y being M to 1 and one or more of the third delay selection signals, and outputting one of the plurality of clock signals to a variable delay part; and the variable delay part comprising one delay element including a flip flop such that the variable delay part receiving the clock signal having a frequency equivalent to F/Y, Y being M to 1, is configured to provide a output signal having a delay of 1 to M unit delays.

The variable delay unit further includes: a second selection unit receiving the output signal of the variable delay part, the input signal, and at least one fourth delay selection signal, the second selection unit outputting either the input signal or the output signal of the variable delay part based on the at least one fourth delay selection signal.

The second selection unit outputs the output signal of the variable delay part when the fourth delay selection signal is at a predetermined level and outputs the input signal when the fourth delay selection signal is not at a predetermined level. One unit delay substantially equals one predetermined cycle of a clock signal utilized in the variable delay circuit.

The variable delay circuit according to yet another embodiment of the present invention includes at least: a counting controller determining when to begin a counting operation and outputting a toggling signal; a counting part counting the toggling signal and outputting a first counting code, wherein an initial value of the first counting code is a fixed value; and an output signal generating part outputting a signal when the first counting code reaches a predetermined value.

The first selection unit outputs the first delayed signal when the second delay selection signal is at a predetermined level and outputs the input signal when the second delay selection signal is not at a predetermined level.

The variable delay unit includes at least: a counting controller determining when to begin a counting operation and outputting a toggling signal; a counting part receiving the third selection delay signal and counting the toggling signal and outputting a second counting code, wherein an initial value of the second counting code is determined based on the third delay selection signal; an output signal generating part outputting a signal when the second counting code reaches the predetermined value.

The variable delay circuit further includes: a second selection unit receiving the output signal of the variable delay unit, the input signal, and at least one fourth delay selection signal, the second selection unit outputting either the input signal or the output signal based on the at least one fourth delay selection signal.

The second selection unit outputs the output signal of the variable delay unit when the fourth delay selection signal is at a predetermined level and outputs the input signal when the fourth delay selection signal is not at a predetermined level. One unit substantially equals one predetermined cycle of a clock signal utilized in the variable delay circuit.

These and various other features as well as advantages which characterize the present invention will be apparent from a reading of the following detailed description of various embodiments of the present invention and a review of the associate drawings.

DETAILED DESCRIPTION OF THE PRESENT INVENTION

There is a need to resolve the problems associated with increased latency control requirement such as the increased circuit size often associated with the multiplexer and decoder circuits in a delay circuit as well as the increased electrical power consumption often associated with the increased number of shift registers in a delay circuit.

One reason behind the increase size of a multiplexer and a decoder in a conventional delay circuit is due to the fact that a "n" number of control signals is required to be produced by the multiplexer in order to select one of the "n" number of shift register output values. Further, when each shift register is designed to produce signal of one latency value, decreasing the sizes of the multiplexer and decoder will hardly reduce the electrical power consumed by the shift registers.

A counter can be used to apply latency. When a counter is used cause latency, it makes possible to begin operating the circuit only after receiving the input signal. But this will require an additional circuit to accommodate for a repeated inputs.

Digital logics are in binary coding, thus the latency value can be produced in binary. This binary latency value can then be decoded in inputted to the multiplexer as the control signal. If you can apply the latency value even with decoding to the multiplexer, you then can eliminate or reduce the size of the decoder. A counter utilizes binary numbers, and thus allows the decoder size to be reduced.

Therefore, as long as the decoder size decrease is greater than the size required for a counter, then this will realize a net size reduction.

Figure 1A:
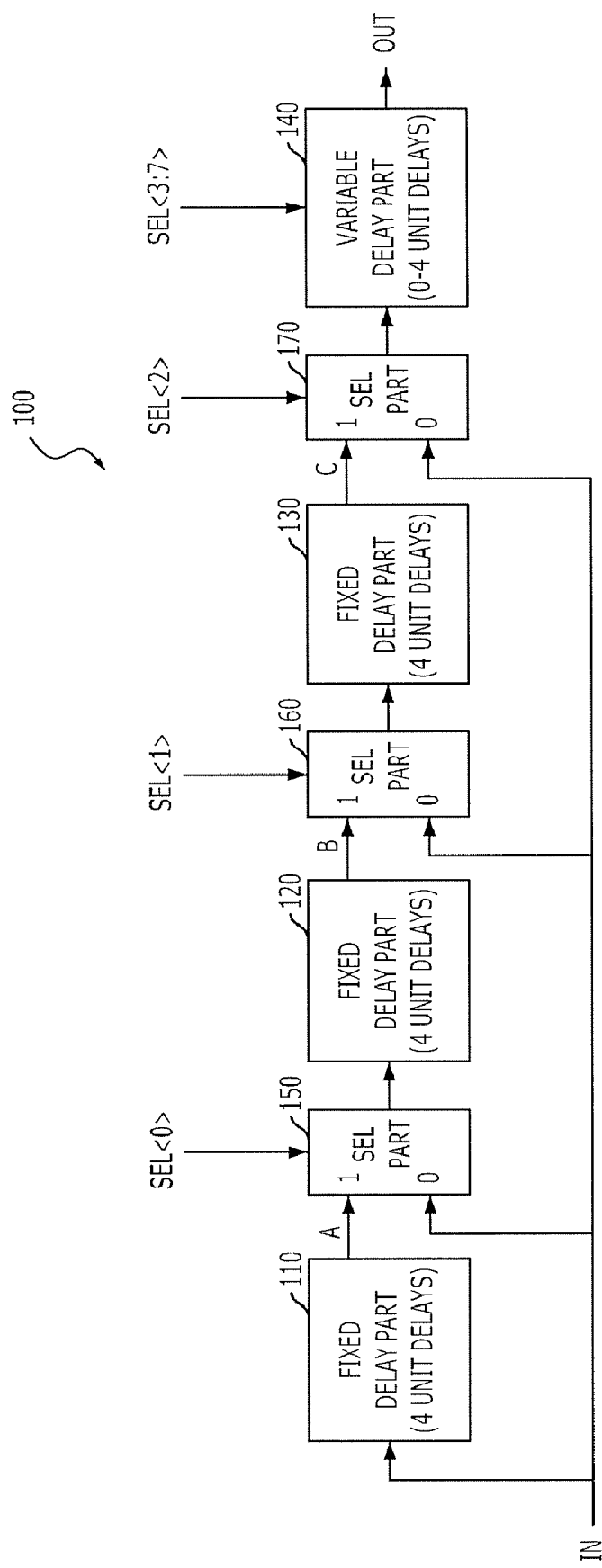
FIG. 1A is a block circuit diagram of a digital delay circuit according to an embodiment of the present invention.

FIG. 1A shows a variable delay circuit 100 capable of delaying an input signal IN by 0 to "n" unit delays where n=16 according to an embodiment of the present invention. The unit delay "n" can be represented in terms of a number of clock cycles, where n=16 in an embodiment as shown in FIG. 1A. The variable delay circuit 100 comprises three fixed delay parts 110, 120, 130 and a variable delay part 140. According to an embodiment as shown in FIG. 1A, each fixed delay part 110, 120, 130 provides 4 units of delay, and the variable delay part 140 provides 0-4 units of delay. Thus, the variable delay circuit 100 utilizes the four delay parts 110, 120, 130, 140 in the manner as shown in TABLE 1 in order to produce 0 to 16 units of delay.

TABLE 1

| Unit delay (s) (e.g., clock cycles) | Fixed Delay Parts | | | Variable Delay Part |
|---|---|---|---|---|
| | 210 | 220 | 230 | 240 |
| 0 | 0 | 0 | 0 | 0 |
| 1 | 0 | 0 | 0 | 1 |
| 2 | 0 | 0 | 0 | 2 |
| 3 | 0 | 0 | 0 | 3 |
| 4 | 0 | 0 | 0 | 4 |
| 5 | 0 | 0 | 4 | 1 |
| 6 | 0 | 0 | 4 | 2 |
| 7 | 0 | 0 | 4 | 3 |
| 8 | 0 | 0 | 4 | 4 |
| 9 | 0 | 4 | 4 | 1 |
| 10 | 0 | 4 | 4 | 2 |
| 11 | 0 | 4 | 4 | 3 |
| 12 | 0 | 4 | 4 | 4 |
| 13 | 4 | 4 | 4 | 1 |

TABLE 1-continued

| Unit delay (s) (e.g., clock cycles) | Fixed Delay Parts | | | Variable Delay Part |
|---|---|---|---|---|
| | 210 | 220 | 230 | 240 |
| 14 | 4 | 4 | 4 | 2 |
| 15 | 4 | 4 | 4 | 3 |
| 16 | 4 | 4 | 4 | 4 |

For example, in order to provide 1 to 4 units of delay, the variable delay part 140 will work to produce the desired delay of 1 to 4. Then, to provide 10 units of delay, the variable delay part 140 providing 2 units of delay will cooperate with the fixed delay parts 120, 130, each providing 4 units of delay. In this manner as shown in TABLE 1 above, the delay parts 110, 120, 130, 140 will cooperate each other to produce 0-16 units of delay. Although FIG. 1A shows that each fixed delay part 110, 120, 130 provides 4 units of fixed delay, it would be a matter of design choice as to what they can provide a different number of fixed unit delays, and it is not necessary that all of the fixed delay part 110, 120, 130 are required to provide the same number of fixed unit delays such as 4. Each fixed delay part 110, 120, 130 may be designed such that each can provide a fixed unit delay that is same or different from any of the others. The variable delay part 140 as shown in FIG. 1A is set to the maximum variable delay of 4; however, this upper range of unit delays can be set to any other unit as desired by the circuit designer. In an embodiment as shown in FIG. 1A, in order to achieve delays of 0-16, the upper range of the variable delay unit (e.g., 4) should be set to be at least the same or greater than the fixed delay of 4 provided by each of the fixed delay parts 110, 120, 130.

Now referring back to FIG. 1A, the delay selection signal SEL<0:7> (i.e., SEL<0>, SEL<1>, ... SEL<7>) will determine how the each of the delay parts 110, 120, 130, 140 will cooperate to provide 0-16 units of delay. A selection part 150 receives a delayed output A or the input signal IN and then determines whether to output A or IN depending on the selection signal SEL<0>. In the same manner, the selection parts 160, 170 receives delayed outputs B, C, respectively, and the input signal IN and then determines whether to output B or IN, or C or IN, respectively. The output of the selection part 170 is then inputted to the variable delay part 140, which will then determine 0-4 units of delay depending on the selection signal SEL<3:7>.

Thus, the variable delay circuit 100 shown in FIG. 1A would be able to delay the input signal IN by 0-16 unit delays determined by the selection signal SEL<0:7> and outputs the delayed output signal OUT. TABLE 2 shows the assignments for SEL<0:7> that will determine which one of 0-16 unit delays will be reflected in the OUT signal provided by the variable delay circuit 200 of FIG. 1A. For example, SEL<X0100001> applied to the variable delay circuit 100 of FIG. 1A will cause for 8 units of delay of the input signal IN; and SEL<11101000> for 13 units of delay.

TABLE 2

| Unit delay (s) | SEL<0> | SEL<1> | SEL<2> | SEL<3> | SEL<4> | SEL<5> | SEL<6> | SEL<7> |
|---|---|---|---|---|---|---|---|---|
| 0 | X | X | 0 | 1 | 0 | 0 | 0 | 0 |
| 1 | X | X | 0 | 0 | 1 | 0 | 0 | 0 |
| 2 | X | X | 0 | 0 | 0 | 1 | 0 | 0 |
| 3 | X | X | 0 | 0 | 0 | 0 | 1 | 0 |
| 4 | X | X | 0 | 0 | 0 | 0 | 0 | 1 |
| 5 | X | 0 | 1 | 0 | 1 | 0 | 0 | 0 |
| 6 | X | 0 | 1 | 0 | 0 | 1 | 0 | 0 |
| 7 | X | 0 | 1 | 0 | 0 | 0 | 1 | 0 |
| 8 | X | 0 | 1 | 0 | 0 | 0 | 0 | 1 |

TABLE 2-continued

| Unit delay (s) | SEL<0> | SEL<1> | SEL<2> | SEL<3> | SEL<4> | SEL<5> | SEL<6> | SEL<7> |
|---|---|---|---|---|---|---|---|---|
| 9  | 0 | 1 | 1 | 0 | 1 | 0 | 0 | 0 |
| 10 | 0 | 1 | 1 | 0 | 0 | 1 | 0 | 0 |
| 11 | 0 | 1 | 1 | 0 | 0 | 0 | 1 | 0 |
| 12 | 0 | 1 | 1 | 0 | 0 | 0 | 0 | 1 |
| 13 | 1 | 1 | 1 | 0 | 1 | 0 | 0 | 0 |
| 14 | 1 | 1 | 1 | 0 | 0 | 1 | 0 | 0 |
| 15 | 1 | 1 | 1 | 0 | 0 | 0 | 1 | 0 |
| 16 | 1 | 1 | 1 | 0 | 0 | 0 | 0 | 1 |

(Note: "X" represents either 0 or 1)

In a conventional delay circuit, one multiplexer or a selection circuit is used for selecting one of signals delayed by 0 to "n" units of delay or clock cycles achieved by utilizing the "n" number of delay elements such as shift registers. For example, for 16 units of delay (i.e., n=16), the conventional delay circuit in would require 17 selection signals S0 to S16 to select any one of 17 delayed signals L0 to L16 that would be generated by the shift registers (albeit L0 being same as the input signal with no delay), all of which seventeen delayed signals L0 to L16 are inputted to the single multiplexer selection unit.

This means that all "n"+1 number of delayed signals L0 to L(n) are inputted to one selection multiplexer circuit (e.g., for n=16, 17 delayed signals L0 to L16), and therefore the loading on the selection multiplexer circuit of a conventional delay circuit as described in the Background section of the present disclosure is much greater than the variable delay circuit 100 as shown in FIG. 1A of an embodiment of the present invention. The greater loading requirement of a conventional delay circuit deteriorates performance of the delay circuit and leads to greater power consumption than the variable delay circuit 100 of FIG. 1A according to an embodiment of the present invention.

The variable delay circuit 100 uses three selection parts 150, 160, 170 that are required to select one of two inputted signals (e.g., A or IN; B or IN; C or IN), which is unlike a conventional single unit selection multiplexer receiving all of the delayed signals L0 to L(n).

Further, the variable delay circuit 100 according to an embodiment of the present invention uses only 8 selection signals SEL<0:7> for 17 different delayed outputs (also see TABLE 2). To the contrary, a conventional delay circuit as described in the Background will require at least 17 selection signals SEL<0:16> for 17 different delayed outputs. This significant reduction of selection signals lead to reduction in required wirings for a variable delay circuit. This is advantageous for achieving a more compact design as well as avoids inter-wire capacitance problems.

Figure 1B:
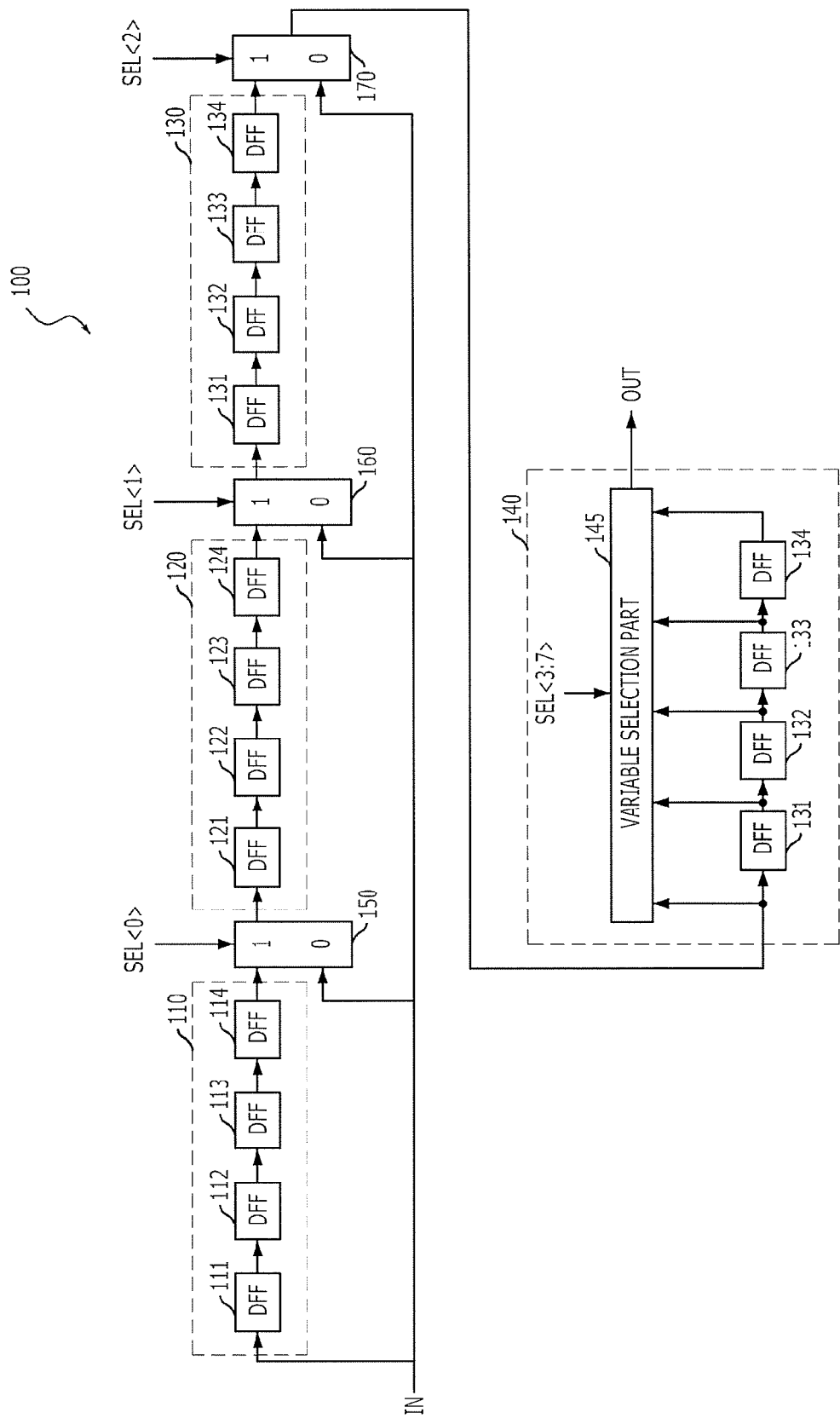
FIG. 1B is a more detailed block circuit diagram of the digital delay circuit of FIG. 1A.

FIG. 1B shows more detailed view of the variable delay circuit 100 as shown in FIG. 1A according to an embodiment of the present invention. Each of the fixed delay parts 110, 120, 130 could be made by serially connected four flip flops (111-114, 121-124, 131-134, respectively) that are synchronized with the clock signal in order to achieve four units of delay at each fixed delay part 110, 120, 130. The number of delay components such as the flip flops in each of fixed delay part 110, 120, 130 can be varied depending on the number of unit delays desired at each fixed delay part 110, 120, 130.

The variable delay part 140 according an embodiment of the present invention also utilizes four serially connected delay components 141-144 such as flip flops; however, the five delayed signals at each input and output end of each delay component 141, 142, 143, 144 are inputted to a variable selection part 145. Four selection signals SEL<3:7> are inputted to the variable selection part 145, and any one of 0-4 units of additional delay to the output signal C is determined by SEL<3:7>. The operations of delay parts 110, 120, 130, 140 in conjunction with selections signals SEL<0:7> when n=16 should be readily understood in reference to TABLES 1-2.

Figure 2:
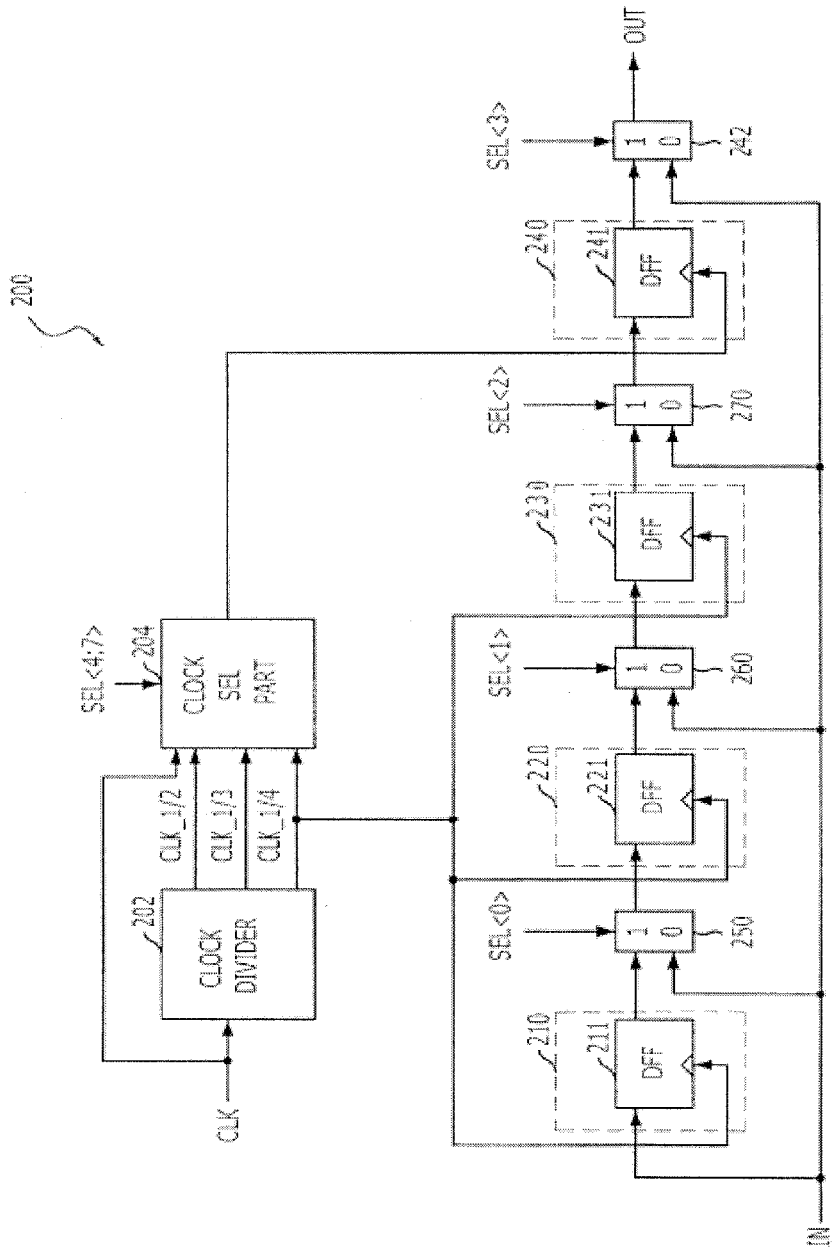
FIG. 2 is a block circuit diagram of a digital delay circuit according to another embodiment of the present invention.

FIG. 2 shows a variable delay circuit 200 according another embodiment of the present invention. The variable delay circuit 200 of FIG. 2 operates in the similar manner as the variable delay circuit 100 of FIGS. 1A-1B but with a lesser number of delay components such as flip flops. This is accomplished by utilizing a clock divider 202 that receives a base clock signal CLK and outputs a multiple divided clock signals CLK-½, CLK-⅓, CLK-¼, all of which are generated based on the inputted base clock signal CLK. The signal delay provided by the variable delay circuit 200 CLK is measured on the basis of the base clock signal CLK. The multiple divided clock signals CLK-½, CLK-⅓, CLK-¼ are generated by the clock divider 202, not for the purposes of measuring the delay, but as a way to minimize the number of delay components being utilized in the circuit as it will be explained in more detail below.

The variable delay circuit 200 is comprised of fixed delay parts 210, 220, 230, and each fixed delay part 210, 220, 230 is made of one flip flop 211, 221, 231 respectively receiving the divided clock signal CLK-¼ from the clock divider 202 for purposes of a predetermined delay of 4 clock cycles. The variable delay part 240 is also comprised of one flip flop 241; however, unlike the fixed delay parts 210, 220, 230, the variable delay part 240 can receive any one of the divided clock signals CLK-½, CLK-⅓, CLK-¼ and CLK determined by the clock selection part 204.

The fractional component in each of the divided clock signals CLK-½, CLK-⅓, CL-¼ represents the frequency of each of the divided clock signals CLK-½, CLK-⅓, CL-¼ in comparison to the frequency of the base clock signal CLK. For example, the frequency of the divided clock signal CLK-½ would be one-half of the frequency of the base clock signal CLK; the frequency of the divided clock signal CLK-⅓ would be one-third of the frequency of the base clock signal CLK; and likewise the frequency of the divided clock signal CLK-¼ would be one-fourth of the frequency of the base clock signal CLK.

According to an embodiment of the present invention as shown in FIG. 2, each of the fixed delay parts 210, 220, 230 provides a fixed delay of 1 cycle of the divided clock signal CLK-¼ that would be equivalent to 4 cycles of the base clock signal CLK. Therefore, each of the fixed delay parts 210, 220, 230 would provide a net delay of 4 cycles measured in terms of the base clock signal CLK.

Alternatively, it would be possible that each of the fixed delay parts 210, 220, 230 could utilize more than one flip flops such as 211, 221, 231, respectively. For example, a fixed delay part (such as 210) could be made of two flip flops connected in series, delaying the CLK-½ signal instead of the CLK-¼ signal. The net delay of CLK-½ delayed by two flip flops in series would be equivalent to a net delay of 4 cycles of the base clock signal CLK. It is possible and is within the scope and spirit of the present invention to utilize different combinations of flip flops or other types of signal delay components in designing each of the fixed delay components 210, 220, 230.

In FIG. 2, the fixed delay parts 210, 220, 230 are arranged in series with one of the selection circuits 250, 260, 270 connecting any two of the fixed delay parts 210, 220, 230 that are connected in series. The selection circuits 250, 260, 270 receive the selections signals SEL<0>, SEL<1>, SE<2> respectively as shown in FIG. 2. The output of the selection part 270 is connected to the variable delay part 240, and the output of the variable delay part 240 is then connected to another selection part 242 receiving the selection signal SEL<3>.

The input signal IN is inputted to the first one 210 of the fixed delay components 210, 220, 230 connected in series. The input signal IN is also inputted to each of the selection parts 250, 260, 270, and 242 (see FIG. 2) receiving the selection signals SEL<0>, SEL<1>, SEL<2>, SEL<3>.

As already discussed above, each of the fixed delay parts 210, 220, 230 receives the divided clock signal CLK-¼. Nevertheless, the variable delay part 240 can receive any one of the divided clock signals CLK-½, CLK-⅓, CLK-¼ and CKL depending on the selection signal SEL<4:7>. For example, when SEL<4> is 1, the clock selection part 204 will output the base clock signal CLK to the variable delay part 240; when SEL<5> is 1, the clock selection part 204 will output the base clock signal CLK-½ to the variable delay part 240; when SEL<6> is 1, the clock selection part 204 will output the base clock signal CLK-⅓ to the variable delay part 240; and similarly, if SEL<7> is 1, the clock selection part 204 will output the base clock signal CLK-¼ to the variable delay part 240.

Therefore, the variable delay part 240 comprising a singe delay element of a flip flop 241 could be capable of delaying anywhere from 1 to 4 depending on the status of the selection signal SEL<4:7>. That is, a net delay of 1 CLK cycle will be caused by the variable delay part 240 when SEL<4> is 1; a net delay of 2 CLK cycles will be caused by the variable delay part 240 when SEL<5> is 1; a net delay of 3 CLK cycles will be caused by the variable delay part 240 when SEL<6> is 1; and a net delay of 4 CLK cycles will be caused by the variable delay part 240 when SEL<7> is 1.

In order to provide 0 delay, the selection part 242 is provide to receive the output signal of the variable delay part 240. The selection part 242 is capable of selecting its output signal as either the IN signal without delay or the output of the variable delay part 240 having the delay depending the selection signal SEL<3>. For example, when SEL<3> is 0 indicating a 0 delay, the selection part 242 would output the IN signal as the final output of the variable delay circuit 200.

Although FIG. 2 shows that the variable delay part 240 is comprised of one flip flop 241, it is within the scope and spirit of the present invention that more than one flip flops or other similar delay elements could comprise the variable delay part 240, in the same manner as the fixed delay parts 210, 220, 230 as discussed above.

Thus, the variable delay circuit 200 shown in FIG. 2 would be able to delay the input signal IN by 0-16 unit delays determined by the selection signal SEL<0:7> and outputs the delayed signal OUT. TABLE 3 shows the assignments for SEL<0:7> that will determine one of 0-16 unit delays will be reflected in the OUT signal provided by the variable delay circuit 200 of FIG. 2. For example, SEL<X0110001> applied to the variable delay circuit 200 of FIG. 2 will cause 8 units of delay of the input signal IN; and SEL<11110100> will cause 13 units of delay.

TABLE 3

| Unit delay (s) | SEL<0> | SEL<1> | SEL<2> | SEL<3> | SEL<4> | SEL<5> | SEL<6> | SEL<7> |
|---|---|---|---|---|---|---|---|---|
| 0 | X | X | X | 0 | X | X | X | X |
| 1 | X | X | 0 | 1 | 1 | 0 | 0 | 0 |
| 2 | X | X | 0 | 1 | 0 | 1 | 0 | 0 |
| 3 | X | X | 0 | 1 | 0 | 0 | 1 | 0 |
| 4 | X | X | 0 | 1 | 0 | 0 | 0 | 1 |
| 5 | X | 0 | 1 | 1 | 1 | 0 | 0 | 0 |
| 6 | X | 0 | 1 | 1 | 0 | 1 | 0 | 0 |
| 7 | X | 0 | 1 | 1 | 0 | 0 | 1 | 0 |
| 8 | X | 0 | 1 | 1 | 0 | 0 | 0 | 1 |
| 9 | 0 | 1 | 1 | 1 | 1 | 0 | 0 | 0 |
| 10 | 0 | 1 | 1 | 1 | 0 | 1 | 0 | 0 |
| 11 | 0 | 1 | 1 | 1 | 0 | 0 | 1 | 0 |
| 12 | 0 | 1 | 1 | 1 | 0 | 0 | 0 | 1 |
| 13 | 1 | 1 | 1 | 1 | 1 | 0 | 0 | 0 |
| 14 | 1 | 1 | 1 | 1 | 0 | 1 | 0 | 0 |
| 15 | 1 | 1 | 1 | 1 | 0 | 0 | 1 | 0 |
| 16 | 1 | 1 | 1 | 1 | 0 | 0 | 0 | 1 |

(Note: "X" represents either 0 or 1)

The variable delay circuit 200 of FIG. 2 utilizing 4 flip flops requires less number of flip flops when it is compared to the variable delay circuit 100 as shown in FIGS. 1A-1B utilizing 16 flip flops. Reduction in the number of flip flops would lead to reduction of the circuit area and reduced power consumption. In the case of the variable delay circuit 200 of FIG. 2, a clock divider 202 would be additionally required when it is compared to the variable delay circuit 100 of FIGS. 1A-1B. However, a clock divider is typically present anyway as a part of the semiconductor memory device; thus, inclusion of a clock divider does not mean an increase in the circuit area. Further, when more than one variable delay circuits 200 of FIG. 2 are designed in a semiconductor memory device, these multiple variable delay circuits such as 200 can share one common clock divider such as 202 that is already found to be present as a part of the memory device. In this regard, the presence of a clock divider 202 in the variable delay circuit 200 of FIG. 2 does not lead to problems due to increased circuit area.

Figure 3A:
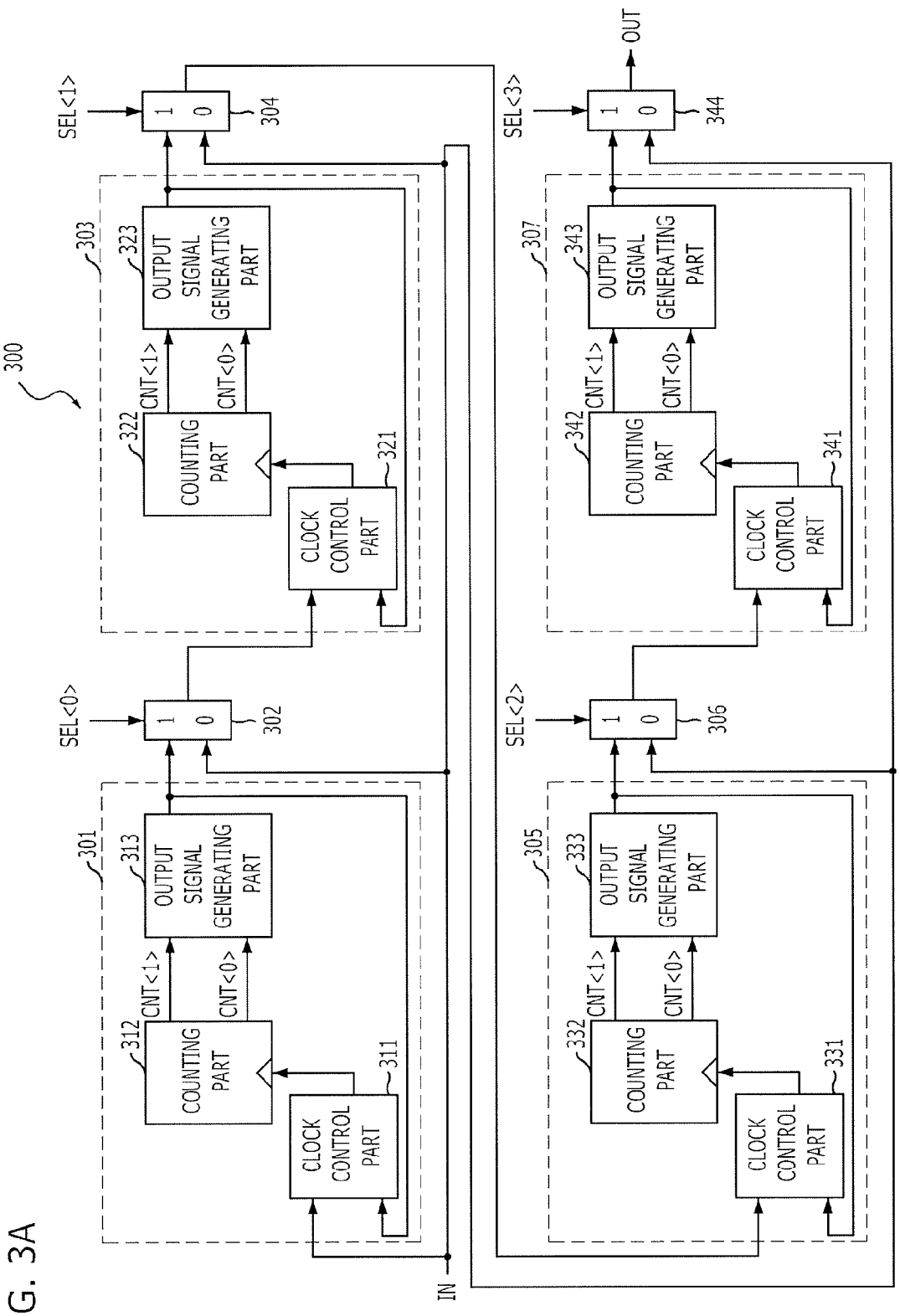
FIG. 3A is a block circuit diagram of a digital delay circuit according to yet another embodiment of the present invention.

FIG. 3A shows a variable delay circuit 300 capable of delaying an input signal IN by 0 to "n" unit delays according to yet another embodiment of the present invention. The unit delay "n" can be represented in terms of a number of clock cycles, where n=16 in various embodiment of the present invention including the one shown in FIG. 3A. The variable delay circuit 300 comprises three fixed delay parts 301, 303, 305 and a variable delay part 307. According to an embodiment as shown in FIG. 3A, each fixed delay part 301, 303, 305 provides 4 units of delay, and the variable delay part 307 provide 0-4 units of delay. However, the maximum delay provided by each of the fixed delay parts 301, 303, 305 and the variable delay part 307 is not limited by 4; it would be a matter of design choice as to setting different units of delay for each of the delay parts 301, 303, 305, and 307.

The fixed and variable delay parts 301, 303, 305, 307 are arranged in series with one of the selection parts 302, 304, 306 connected between two variable delay parts as shown in FIG. 3A. Additionally, a selection part 344 is connected to receive the output signal from the variable delay part 307, and the final delayed output signal OUT is outputted by the selection part 344. The input signal IN is inputted to the variable delay part 301, and each of the selection parts 302, 304, 306, 344.

Each of the fixed delay parts 301, 303, 305 comprises a clock control part 311, 321, 331 respectively; a counting part 312, 322, 332 respectively; an output signal generating part 313, 323, 333, 343 respectively. Each of the fixed delay parts 301, 303, 305 operates in a same way; thus, the details of the operation will be described in detail hereinbelow with respect to the fixed delay part 301 as shown in FIG. 3B.

Figure 3B:
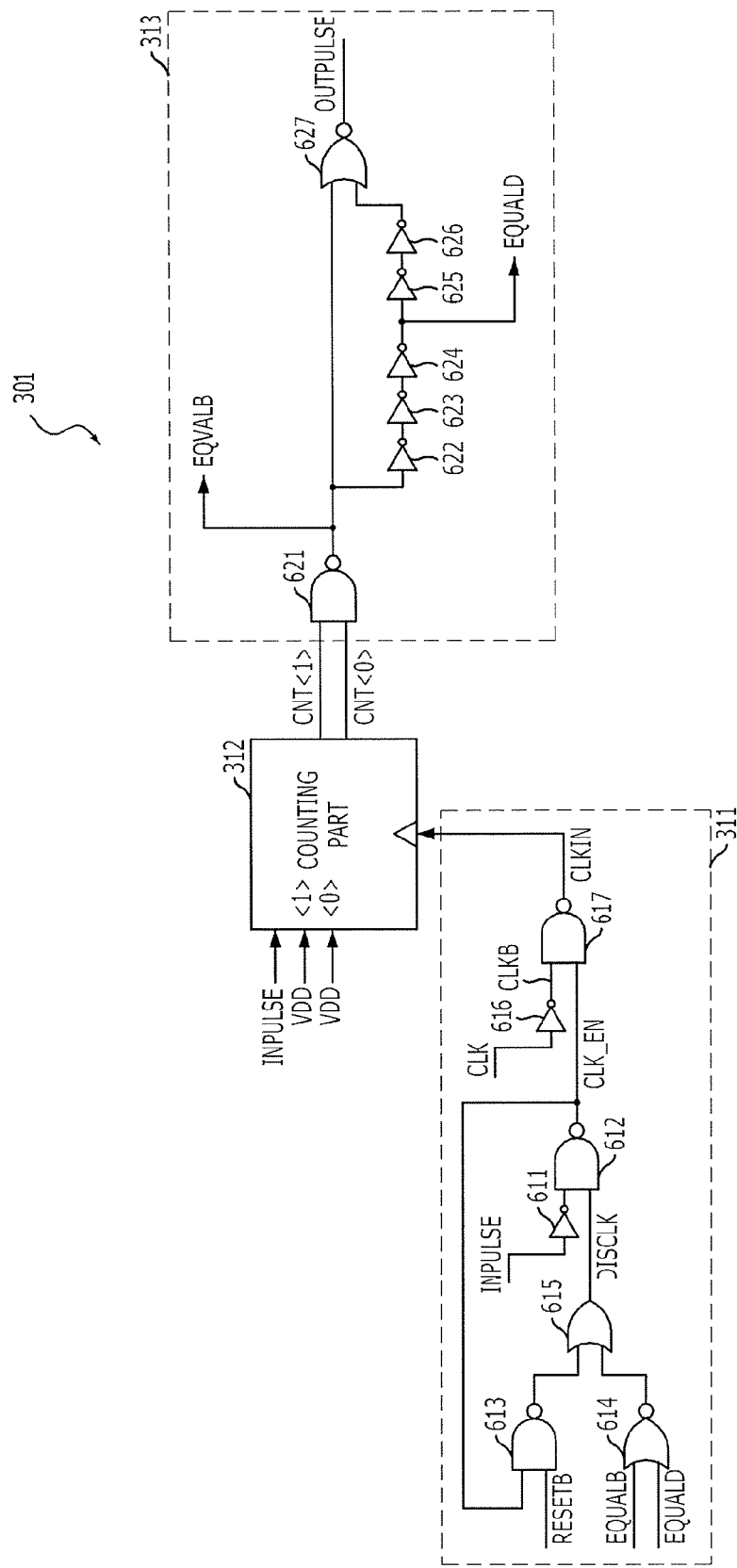
FIG. 3B is a circuit diagram of a fixed delay part 301 of a variable delay circuit shown in FIG. 3A.

FIG. 3B shows detailed circuit diagram of the fixed delay part 301. Accordingly, the detailed operation of the variable delay circuit 300 will be described in detail below.

Referring to FIGS. 3A-3B, a pulse signal INPULSE to the inverter 611 of the clock control part 311 and to the counting part 312. For the clock control parts 321, 331, 341 of FIG. 3A, the INPULSE signals would be the output signals of the selection part 302, 304, 306 respectively. In the fixed delay part 301, the pulse signal INPULSE is inputted to the inverter 611, and the delayed pulse signal OUTPULSE outputted by the NOR gate 627 of the output signal generator part 313 is the signal delayed by the predetermined unit delay, which is set to 4 according to an embodiment of the present invention. That is, the OUTPULSE signal outputted by the fixed delay parts 301, 303, 305 are inputted to the selection parts 302, 304, 306 respectively.

A reset signal RESETB is inputted to the NAND gate 613 of the clock control part 311, and the reset signal RESETB is set to a predetermined level (e.g., low) during the period that the variable delay circuit 300 is not operating and set to another predetermined level (e.g., high) during the period of variable delay circuit 300 in operation. The counter control part 311 also receives two control signals EQUALB, EQUALD from the output signal generator part 313. The two control signals EQUALB, EQUALD are the signals that reflect and are related to the OUTPULSE signal being outputted. That is, as an alternative to EQUALB, EQUALD controls, it would also be possible to design the counter control part 311 to receive the OUTPULSE signal as the feedback signal instead of the EQUALB and EQUALD control signals. The fixed delay part 301 enables CLKIN signal to the counting part 312 in response to the INPULSE signal and disables the CLKIN signal based on the EQUALB and EQUALD control signals.

The counting part 312 counts the CLKIN signal and outputs the counting code CNT<1:0> to the output signal generating part 313. The output signal generating part 313 would generate the OUTPULSE signal when the counting code CNT<1:0> has reached a predetermined count level.

The circuit of clock control part 311 is comprised of inverters 611, 616; NAND gates 612, 613, 617; NOR gates 614, 615 arranged in the manner as shown in FIG. 3B. The clock control part 311 operates to toggle the CLKIN signal during the period between the time the INPULSE signal is set high and the time the OUTPULSE signal is outputted. Outside this period, the clock control part 311 does not allow the CLKIN signal from being toggled.

The counting part 312 initializes the counting code CNT<1:0> to a predetermined count level at the time the INPULSE signal is inputted. As mentioned previously, when the INPULSE signal is inputted, the CLKIN signal inputted to the counting part 312 will begin to toggle. Accordingly, when the INPULSE signal is inputted, the counting part 312 will begin counting from the predetermined count level. According to an embodiment as shown in FIG. 3B, the predetermined count level of the counter code CNT<1:0> is (1, 1); however, it should be readily understood that a different value could be preset depending on the requirements of the design.

The output signal generating part 313 is comprised of a NAND gate 621, inverters 622-626, and a NOR gate 627. The output signal generating part 313 outputs the OUTPULSE signal when the counter code CNT<1:0> reaches the predetermined count level of (1, 1). When the INPUTPUSLE signal is inputted, the counter code CNT<1:0> is initialized to (1, 1) and at this time the CLKIN begins to be counted by the counter part 312. And when the counting code CNT<1:0> is again set to (1, 1), the OUTPULSE signal is outputted. Therefore, the output signal OUTPULSE is outputted after a predetermined delay of 4 clock cycles.

Now referring to a timing diagram of FIG. 3C, the operations of the fixed delay part 301 of the variable delay circuit 300 will be described in more detail. During the time interval before the INPULSE signal is set to high, the clock enable signal CLK_EN is set to low, which will not allow the counting part 312 to receive the CLKIN signal as being toggled according to the clock signal CLKB, which is the inverted signal of CLK. Then, when the pulse of the INPULSE signal is received, the CLK_EN signal is enabled to high and the counting code CNT<1:1> is initialized to (1,1).

When the clock enable signal CLK_EN is high, the CLKIN signal will be inputted to the counting part 312 as a toggling signal. The counting part 312 will begin to count the counting value CNT<1:0> from the initial value of (1,1) to (0,0) to (0,1) to (1,0) to (1,1) based on the toggling of the CLKIN signal. When the counting value CNT<1:0> counts to (1,1), the EQUALB control signal would transition from a low level to a high level; and after a delay, the EQUALD control signal would transition from a high level to a low level. While both EQUALB and EQUALD control signals are low, the OUTPULSE pulse is generated as shown in FIG. 3C. The clock enable signal CLK_EN will then transition to a low level, which will then cause the counting part 312 from counting. Thus, according to an embodiment as shown in FIGS. 3A-3C, the output pulse signal OUTPULSE is generated after a four clock cycle delay from the time the INPULSE pulse is inputted.

Figure 3C:
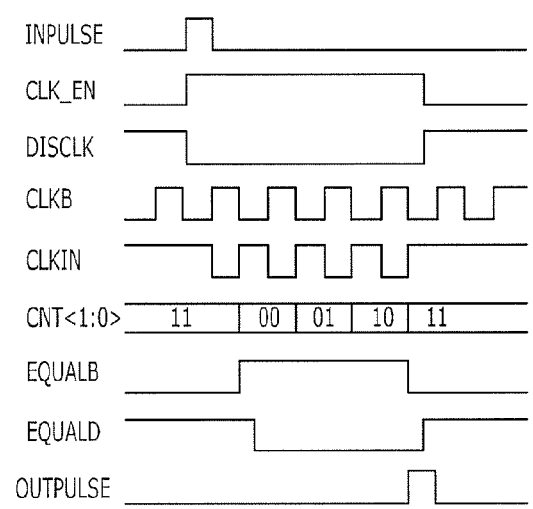
FIG. 3C is a timing diagram to illustrate operations of a fixed delay part 301 of a variable delay circuit shown in FIGS. 3A-3B.

The clock control part 311 of the fixed delay part 301 of FIGS. 3A-3B outputs therefore the toggling CLKIN signal as shown in FIG. 3C between two pulse signals INPULSE and OUTPULSE. This means that the fixed delay part 301 consumes power during the two pulse signals INPULSE and OUTPULSE and substantially no power consumed outside these two pulse signals INPULSE and OUTPULSE. This will lead to significant reduction of power consumption of the first delay part 301.

Figure 3D:
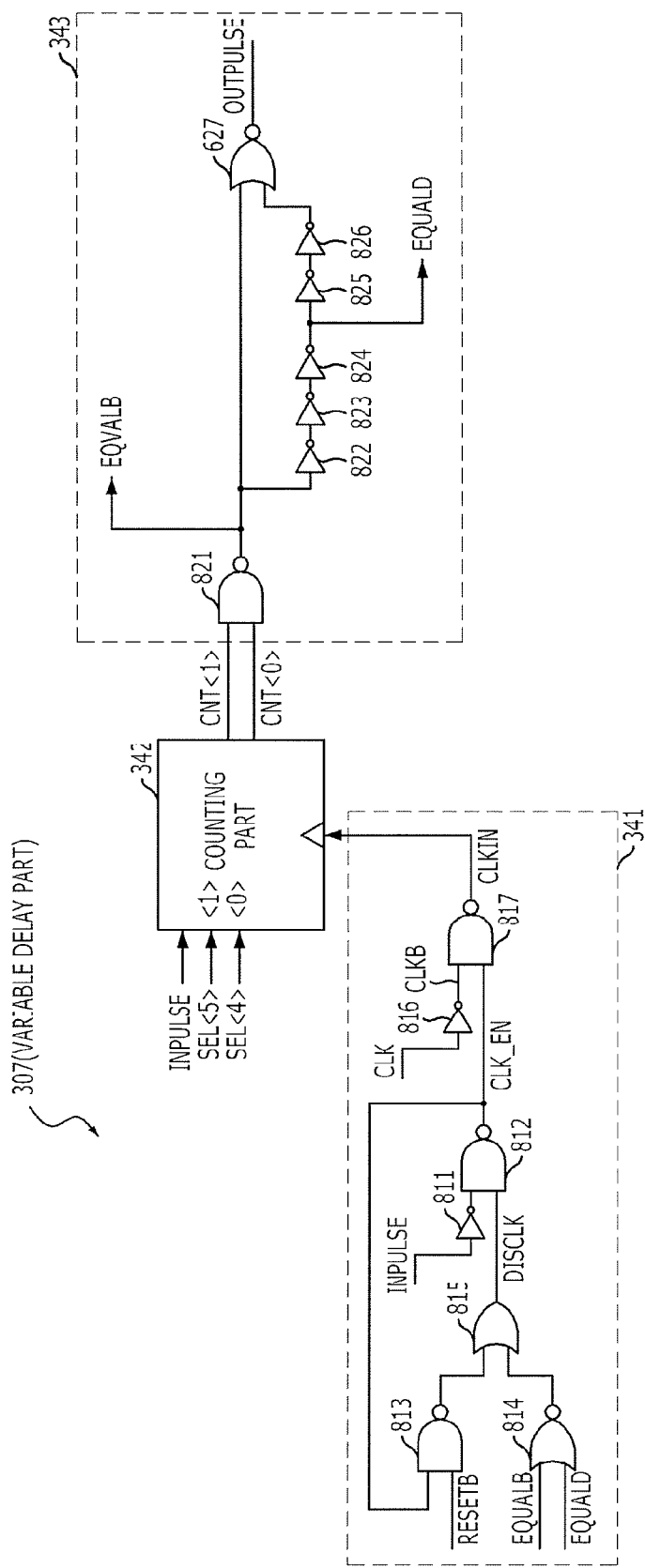
FIG. 3D is a circuit diagram of a variable delay part 307 of a variable delay circuit shown FIG. 3A.
Figure 3E:
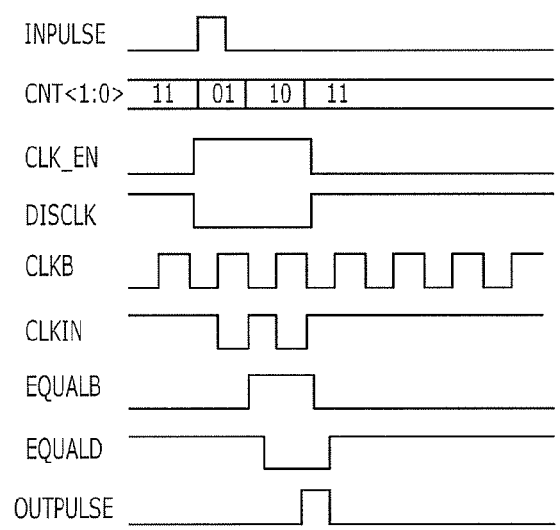
FIG. 3E is a timing diagram to illustrate operations of a variable delay part 307 of a variable delay circuit shown in FIGS. 3A and 3D.

FIG. 3D shows the detailed circuit diagram of the variable delay part 307 as shown in FIG. 3A according an embodiment of the present invention. FIG. 3E is a timing diagram for operations of the variable delay part 307 of FIGS. 3A and 3D. In FIG. 3D, the INPULSE pulse signal is the signal that is delayed by the variable delay circuit 307, and the OUTPULSE is the signal outputted by the variable delay part 307. The reset signal RESETB of the variable delay circuit 307 remains at a predetermined level (e.g., low) when the variable delay circuit 307 is not in operation and at another predetermined level (e.g., high) when the variable delay circuit 307 is in operation.

Referring to the circuit timing diagram of FIG. 3E in combination with the circuit diagram of the variable delay part 307 of FIG. 3D, the variable delay part 307 comprises a counter control part 341 that enables the CLKIN signal in response to the INPULSE signal and disables the enabled CLKIN signal based on the EQUALB and EQUALD signals. Based on the EQUALB and EQUALD signals, the OUTPULSE signal is generated. The basic circuit structure of the counter control part 341 of the variable delay circuit 300 is same as the counter control parts 311, 321, 331 of the fixed delay parts 301, 303, 305 shown in FIGS. 3A-3C.

The variable delay part 307 is also comprised of the counting part 342, which receives the CLKIN toggle signal outputted from the counter control part 341. The variable delay part 307 is additionally comprised of the counting part 342 which counts the CLKIN signal and outputs the counting code CNT<1:0> and of the output signal generating part 343 that outputs the OUTPULSE when the counting code CNT<1:0> is counted to a predetermined value.

The variable delay part 307 as shown in FIG. 3D is substantially identical to the fixed delay part 301, 303, 305. However, the variable delay part 307 is different from the fixed delay parts 301, 303, 305 in that the initial counting code CNT<1:0> of the counting part 342 in the variable delay part 307 could be set to a value other than the (1, 1), which is the case for the fixed delay part 301, 303, 305.

That is, the counting part 342 initializes the counting code CNT<1:0> to SEL<4:5> in response to the input of the INPULSE signal. In an embodiment as shown in FIG. 3D, the counting value CNT<1> will be initialized to the value of the selection signal SEL<5>, and the counting value CNT<0> will be initialized to the value of the selection signal SEL<5> in response to the input of the pulse signal INPULSE. This is different from the counting part 312 of a fixed delay part 301 as shown in FIG. 3B, in which the counting part 312 is always initialized to a counting value CNT<1:0> of (1:1). Instead, the counting value CNT<1:0> of the counting part 342 can be initialized to any one of (1, 1), (0, 0), (0, 1), and (1, 0) depending on the selection signal SEL<5, 4>. This allows the counting part 542 to vary the number of counts anywhere from 0-4 clock cycles that would be equivalent to the 0-4 delay of the variable delay part 307.

Now referring to the timing diagram of FIG. 3E, the operations of the variable delay part 307 as shown in FIG. 3D will be explained in more detail. The clock enable signal CLK_EN will remain in a low level before a pulse signal INPULSE is inputted to the variable delay part 307. While the CLK_EN signal remain at a low level, the CLKIN signal inputted to the counting part 342 is not a toggling signal. This changes when the input pulse signal INPULSE is inputted to the variable delay part 307 at which time, the clock enable signal CLK_EN is set to a high level and the counting value CNT<1:0> is initialized to SEL<5,4>. As shown in FIG. 3E, initial counting value CNT<1,0> of the counting part 342 is (0,1). During the period the clock enable signal CLK_EN is set to a high level, the CLKIN signal inputted to the counting part 342 from the counter control part 341 is a toggling signal as shown in FIG. 3E. In response to the toggling CLKIN signal, the counting part 342 would start the counting operation from the initialized counting value CNT<1:0>, which is (0, 1) in an embodiment as shown in FIG. 3E. When the counting value CNT<1:0> counts to (1,1), the EQUALB control signal would transition from a low level to a high level; and after a delay, the EQUALD control signal would transition from a high level to a low level. While both EQUALB and EQUALD control signals are low, the OUTPULSE pulse is generated as shown in FIG. 3E. The clock enable signal CLK_EN will then transition to a low level, which will then cause the counting part 342 from counting. Thus, according to an embodiment as shown in FIGS. 3D-3E, the output pulse signal OUTPULSE is generated after a two clock cycle delay from the time the INPULSE pulse is inputted. In this manner, the variable delay part 307 is capable of varying the delay to any unit delay anywhere from 0 to 4 clock cycles depending on the initialized counting value CNT<5:4> that will be preset according to the selection signal SEL<5:4>.

It will be clear that the present invention is well adapted to attain the ends and advantages mentioned as well as those that are inherent therein. While a various embodiments including the presently preferred one have been described for purposes of this disclosure, various changes and modifications can be made, which are well within the scope of the present invention. Numerous other changes may be made which readily suggest themselves to those skilled in the art and which are encompassed in the spirit of the invention disclosed and as defined in the appended claims.

What is claimed is:

1. A variable delay circuit comprising:
X number of fixed delay parts having a fixed delay, each delaying an inputted signal, where X is a positive integer;
X number of first selection parts, each receiving an input signal and one of the X number of fixed delay parts' output signal, and each selecting and outputting one of received signals in response to one of X number of first selection signals, wherein the X number of fixed delay parts and the X number of first selection parts are connected in series in an alternative manner;
a variable delay part having a delay receiving an output signal of the last one of the X number of first selection parts, delaying the output signal of the last one of the X number of first selection parts by a delay value determined by one or more of second selection signals;
a second selection part, receiving the input signal and an output signal of the variable delay part, selecting and outputting one of received signals in response to a third selection signal.

2. The variable delay circuit of claim 1, wherein the fixed delay value is M unit delays, and wherein the delay value of the variable delay part is 1 to N unit delays, where M and N is a positive integer.

3. The variable delay circuit of claim 2, wherein one unit delay substantially equals one predetermined cycle of a clock signal utilized in the variable delay circuit.

4. The variable delay circuit of claim 1, wherein the first selection parts outputs the one of the X number of fixed delay parts' output signal when the received one of the X number of first selection signals is at a predetermined level and outputs the input signal when the received one of the X number of first signal is not at a predetermined level.

5. The variable delay circuit of claim 1, wherein the second selection part outputs the output signal of the variable delay part when the third selection signal is at a predetermined level and outputs the input signal when the third selection signal is not at a predetermined level.

6. The variable delay circuit of claim 1 further comprising:
a clock divider receiving a clock signal having a frequency of F and outputting a plurality of clock signals of different frequencies,
wherein a clock signal having a frequency equivalent to F/M is provided to the X number of fixed delay parts, and
wherein the plurality of clock signals having frequencies of F/Y, Y being M to 1, are provided to the variable delay part.

7. The variable delay circuit of claim 6, wherein each of the fixed delay parts comprises one delay element including a flip flop such that each delay element receiving the clock signal having a frequency equivalent to F/M is configured to provide a delay of M unit delays.

8. The variable delay circuit of claim 1, wherein the variable delay part comprises:
a clock selection part receiving the plurality of clock signals having frequencies of F/Y, Y being M to 1 and one or more of the second delay selection signals, and outputting one of the plurality of clock signals to the variable delay part; and
one delay element including a flip flop such that the variable delay part receiving the clock signal having a frequency equivalent to F/Y, Y being M to 1, is configured to provide a output signal having a delay of 1 to M unit delays.

9. The variable delay circuit of claim 1, wherein each of the fixed delay parts comprises:
a counting controller determining when to begin a counting operation and outputting a toggling signal;
a counting part counting the toggling signal and outputting a first counting code, wherein an initial value of the first counting code is a fixed value;
an output signal generating part outputting a signal when the first counting code reaches a predetermined value.

10. The variable delay circuit of claim 1, wherein the variable delay part comprises:
a counting controller determining when to begin a counting operation and outputting a toggling signal;
a counting part receiving the one or more of second selection delay signals and counting the toggling signal and outputting a second counting code, wherein an initial value of the second counting code is determined based on the one or more of second delay selection signals;
an output signal generating part outputting a signal when the second counting code reaches the predetermined value.

11. A variable delay circuit comprising:
a fixed delay unit receiving an input signal and at least one first delay selection signal indicative of a first delay, the fixed delay unit outputting a first delayed signal that is substantially the input signal delayed by the first delay;
a first selection unit receiving the input signal, the first delayed signal, and at least one second delay selection signal, the first selection unit outputting either the input signal or the first delayed signal based on the at least one second delay selection signal; and
a variable delay unit receiving the output signal of the first selection unit and at least one third delay selection signal indicative of a third delay, the variable delay unit outputting a delayed output signal that is substantially the output signal of the selection unit delayed by a third delay,
wherein the first delay is 0 or a fixed delay of X multiples of M unit delays, and wherein the third delay is a delay selected from 0 to N unit delays, where X, M, or N is a positive integer,
wherein the fixed delay unit comprises:
X number of fixed delay parts, each delaying an inputted signal by M unit delays;
X−1 number of selection parts, each receiving one of X−1 number of first selection signals,
wherein the X number of fixed delay parts and the X−1 number of selection parts are connected in series in an alternating manner such that one selection part is connected between two fixed delay parts;
wherein the input signal is applied to the first fixed delay part of the series and to each of the selection parts in the series;
wherein each selection part receives the delayed output of the previous connected fixed delay part and outputs either the received delayed signal or the input signal to the next fixed delay part connected in series; and
wherein the last fixed delay part connected in series outputs the delayed signal to the first selection unit,
wherein the first selection unit outputs the first delayed signal when the second delay selection signal is at a predetermined level and outputs the input signal when the second delay selection signal is not at a predetermined level
wherein the variable delay unit comprises:
N number of delay elements connected in series, each delay element being configured to provide 1 unit delay; and
a variable selection part receiving the output of the first selection unit, the outputs of the N number of delay elements, and the third delay selection signal,
wherein the variable selection part is configured to output any one of the received signals as the output delay signal based on the third delay selection signal,
wherein the third delay selection signal comprises N+1 number of signals.

* * * * *